United States Patent
Lee et al.

(10) Patent No.: US 11,196,229 B2
(45) Date of Patent: Dec. 7, 2021

(54) LASER DIODE CURRENT DRIVING APPARATUS

(71) Applicant: STMICROELECTRONICS (RESEARCH & DEVELOPMENT) LIMITED, Marlow (GB)

(72) Inventors: Denise Lee, Edinburgh (GB); Graeme Storm, Kirkliston (GB); Aravind Venugopalan Nair Jalajakumari, Edinburgh (GB); Alexios Alexandropoulos, Edinburgh (GB)

(73) Assignee: STMICROELECTRONICS (RESEARCH & DEVELOPMENT) LIMITED, Marlow (GB)

( * ) Notice: Subject to any disclaimer, the term of this patent is extended or adjusted under 35 U.S.C. 154(b) by 155 days.

(21) Appl. No.: 16/440,619

(22) Filed: Jun. 13, 2019

(65) Prior Publication Data

US 2019/0393674 A1  Dec. 26, 2019

(30) Foreign Application Priority Data

Jun. 21, 2018  (EP) .................................... 18179161

(51) Int. Cl.
| | | |
|---|---|---|
| *H01S 5/042* | (2006.01) | |
| *H02M 3/07* | (2006.01) | |
| *H01S 5/068* | (2006.01) | |
| *G01S 7/481* | (2006.01) | |
| *G01S 17/06* | (2006.01) | |

(52) U.S. Cl.
CPC ............ *H01S 5/042* (2013.01); *H01S 5/0428* (2013.01); *H01S 5/06825* (2013.01); *H02M 3/07* (2013.01); *G01S 7/4814* (2013.01); *G01S 17/06* (2013.01)

(58) Field of Classification Search
CPC .... H01S 5/042; H01S 5/06825; H01S 5/0428; H02M 3/07
See application file for complete search history.

(56) References Cited

U.S. PATENT DOCUMENTS

| | | | |
|---|---|---|---|
| 5,666,045 A | * | 9/1997 | Grodevant .............. H01S 5/042 323/282 |
| 9,973,082 B1 | * | 5/2018 | Nakagawa ........... H03K 17/063 |
| 2003/0235062 A1 | | 12/2003 | Burgyan et al. |
| 2008/0136500 A1 | | 6/2008 | Frulio et al. |
| 2015/0346749 A1 | | 12/2015 | Bernardon |
| 2018/0083419 A1 | | 3/2018 | Lee |
| 2019/0393674 A1 | | 12/2019 | Lee et al. |

FOREIGN PATENT DOCUMENTS

| | | |
|---|---|---|
| CN | 101489335 A | 7/2009 |
| CN | 101563845 A | 10/2009 |
| CN | 101873744 A | 10/2010 |
| CN | 102892222 A | 1/2013 |
| CN | 210040875 U | 2/2020 |

\* cited by examiner

Primary Examiner — Yuanda Zhang
(74) Attorney, Agent, or Firm — Slater Matsil, LLP (57) ABSTRACT

A driver circuit for a laser diode is configured to pass a current. The circuit includes a charge-pump configured to generate an output boosted positive supply rail voltage. At least one switch is configured to couple the output of the charge-pump to a terminal of the laser diode and to isolate the positive supply rail from the terminal of the laser diode when the charge-pump is enabled.

20 Claims, 5 Drawing Sheets

LASER DIODE CURRENT DRIVING APPARATUS

CROSS-REFERENCE TO RELATED APPLICATIONS

This application claims priority to European Patent Application No. 18179161.7, filed on Jun. 21, 2018, which application is hereby incorporated herein by reference.

TECHNICAL FIELD

Some embodiments relate to a laser diode current driving apparatus.

BACKGROUND

Circuits and methods of driving Laser Diodes (LD) such as vertical cavity surface emitting laser (VCSEL) diodes are known.

An issue with conventional current drivers is one of driving current to the laser diode within the diode's linear range and furthermore being able to do so within the limitation of the driver circuit topology and supply voltage headroom.

Conventional laser diode driver circuit topology attempts to maintain that the laser diode current remains invariant to varying supply voltage levels, but limitations exist where, for levels in which the headroom limit is exceed, the laser diode output current range is no longer linear. This produces the effect of a tapering down of peak current. Furthermore this prevents linear granularity of control in output optical power and furthermore reproduction (D/A) of distortion free waveforms.

SUMMARY

Embodiments relate to a laser diode current driving apparatus. Particular embodiments relate to a laser diode current driving apparatus for supplying current for laser diodes in single photon avalanche diode based time-of-flight systems. Other embodiments are envisioned.

According to a first aspect, a driver circuit for a laser diode is configured to pass a current. The circuit comprises a charge-pump configured to generate an output boosted positive supply rail voltage. At least one switch is configured to couple the output of the charge-pump to a terminal of the laser diode and to isolate the positive supply rail from the terminal of the laser diode when the charge-pump is enabled.

The switch may be further configured to isolate the output of the charge-pump from the terminal of the laser diode and to couple the positive supply rail to the terminal of the laser diode when the charge-pump is disabled.

The driver circuit may comprise a drive transistor configured to supply the laser diode with a controllable current and a regulator configured to control the drive transistor. The regulator comprises at least one input for indicating a controllable current target value and a forward biased modeled voltage generator configured to model the laser diode. The driver circuit may also comprise at least one further switch configured to couple the output of the charge-pump to the regulator when the charge-pump is enabled and couple the positive supply rail to the regulator when the charge-pump is disabled.

The driver circuit may further comprise a charge-pump regulator voltage generator configured to supply an input voltage to the charge-pump. The charge-pump regulator voltage generator comprises one of a static charge-pump regulator voltage generator and a dynamic charge-pump regulator voltage generator.

The static charge-pump regulator voltage generator may comprise a feed-back loop comparing a portion of the output of the charge-pump to a determined reference voltage.

The dynamic charge-pump regulator voltage generator may comprise a comparator comparing a portion of the controllable current target value and a further forward biased modeled voltage generator configured to model the laser diode, at least one another switch configured to couple the output of the charge-pump to the further forward biased modeled voltage generator when the charge-pump is enabled and couple the positive supply rail to the further forward biased modeled voltage generator when the charge-pump is disabled.

The at least one switch may comprise a bulk switch.

The bulk switch may comprise an inverter configured to receive a charge-pump enable signal and configured to output an inverted charge-pump enable signal, a first PMOS transistor configured with a gate node coupled to the inverted charge-pump enable signal, a source node coupled to a charge-pump output and a bulk and drain node coupled to a bulk switch output, a second PMOS transistor configured with a source node coupled to a lower voltage input and a bulk and drain node coupled to the bulk switch output, a third PMOS transistor configured with a drain node coupled to a gate node of the second PMOS transistor, a source node coupled to the charge-pump output, a bulk node coupled to the bulk switch output and a gate node coupled to the inverted charge-pump enable signal, a NMOS transistor configured with a drain node coupled to the gate node of the second PMOS transistor, a source node and a bulk node coupled to a ground node and a gate node coupled to the inverted charge-pump enable signal.

A range detector may comprise the driver circuit as described herein. The range detector may comprise a first state machine configured to confirm the operations of clocking circuitry, a second state machine configured to confirm the operations of the driver circuitry, and a third state machine configured to confirm the operations of the charge-pump. The operations of the third state machine are initialized by the operations of the second state machine.

According to a second aspect, a method for driving a laser diode comprises providing a charge-pump to generate an output boosted positive supply rail voltage, and when the charge-pump is enabled, coupling via at least one switch the output boosted positive supply rail voltage to a terminal of the laser diode, and isolating via the least one switch the positive supply rail from the terminal of the laser diode when the charge-pump is enabled.

The method may comprise, when the charge-pump is disabled, isolating via the at least one switch the output boosted positive supply rail of the charge-pump from the terminal of the laser diode, and coupling via the at least one switch the positive supply rail to the terminal of the laser diode.

The method may further comprise supplying the laser diode with a controllable current using a drive transistor, controlling the drive transistor by a regulator configured to receive a controllable current target value, coupling the output of the charge-pump to the regulator when the charge-pump is enabled, and coupling the positive supply rail to the regulator when the charge-pump is disabled.

The method may further comprise supplying, by a charge-pump regulator voltage generator, an input voltage to the charge-pump. The charge-pump regulator voltage generator comprises one of a static charge-pump regulator voltage generator, and a dynamic charge-pump regulator voltage generator.

The method may comprise, wherein supplying, by the charge-pump regulator voltage generator, an input voltage to the charge-pump, comprises comparing a portion of the output of the charge-pump to a determined reference voltage.

The charge-pump regulator voltage generator may supply an input voltage to the charge-pump by comparing a portion of the controllable current target value and a voltage model the laser diode, coupling the output of the charge-pump as an input of the voltage model the laser diode when the charge-pump is enabled, and coupling the positive supply rail as an input an input of the voltage model the laser diode when the charge-pump is disabled.

According to a third aspect there is provided a circuit for a laser diode configured to pass a current. The circuit comprises a voltage generator for generating an output boosted positive supply rail voltage and at least one switch for coupling the output boosted positive supply rail voltage to a terminal of the laser diode and isolating a positive supply rail from the terminal of the laser diode when the voltage generator is enabled.

The switch may further comprise an isolation element for isolating the output of the voltage generator from the terminal of the laser diode and coupling the positive supply rail to the terminal of the laser diode when the charge-pump is disabled.

The circuit may comprise a driver for supplying the laser diode with a controllable current and a regulator for controlling the driver. The regulator comprises at least one input for indicating a controllable current target value and a forward biased modeled voltage generator configured to model the laser diode. The circuit may also comprise at least one further switch for coupling the output of the voltage generator when the voltage generator is enabled and coupling the positive supply rail to the regulator when the voltage generator is disabled.

The driver circuit may further comprise an input voltage circuit for supplying an input voltage to the voltage generator. The input voltage circuit comprises one of a static charge-pump voltage generator and a dynamic charge-pump regulator voltage generator.

The static charge-pump regulator voltage generator may comprise a feed-back loop comparing a portion of the output of the voltage generator to a determined reference voltage.

The input voltage circuit may comprise a comparator comparing a portion of the controllable current target value and a further forward biased modeled voltage generator configured to model the laser diode, at least one another switch for coupling the output of the voltage generator to the further forward biased modeled voltage generator when the voltage generator is enabled and couple the positive supply rail to the further forward biased modeled voltage generator when the voltage generator is disabled.

The at least one switch may comprise a bulk switch.

The bulk switch may comprise an inverter configured to receive a charge-pump enable signal and configured to output an inverted charge-pump enable signal, a first PMOS transistor configured with a gate node coupled to the inverted charge-pump enable signal, a source node coupled to a charge-pump output and a bulk and drain node coupled to a bulk switch output, a second PMOS transistor configured with a source node coupled to a lower voltage input and a bulk and drain node coupled to the bulk switch output, a third PMOS transistor configured with a drain node coupled to a gate node of the second PMOS transistor, a source node coupled to the charge-pump output, a bulk node coupled to the bulk switch output and a gate node coupled to the inverted charge-pump enable signal, a NMOS transistor configured with a drain node coupled to the gate node of the second PMOS transistor, a source node and a bulk node coupled to a ground node and a gate node coupled to the inverted charge-pump enable signal.

A range detector may comprise the circuit as described herein. The range detector may comprise a first state machine for confirming the operations of clocking circuitry, a second state machine for confirming the operations of the driver circuitry, and a third state machine for confirming the operations of the charge-pump. The operations of the third state machine are initialized by the operations of the second state machine.

BRIEF DESCRIPTION OF THE DRAWINGS

Some embodiments will now be described by way of example only and with reference to the accompanying Figures in which.

DETAILED DESCRIPTION OF ILLUSTRATIVE EMBODIMENTS

The concept as embodied herein is shown by apparatus and methods for controlling laser diode driver currents using an internal (on-chip) step up switching regulator (or charge-pump) that is able to deliver the performance needs at a system level, with the externally supplied voltage.

The concept is based on embodiments where are configured to generate a step-up supply voltage, for purpose of enabling operation of laser diode (VCSEL) driver with higher peak laser current, not limited by the operating supply of driver and periphery circuitry.

Figure 1:
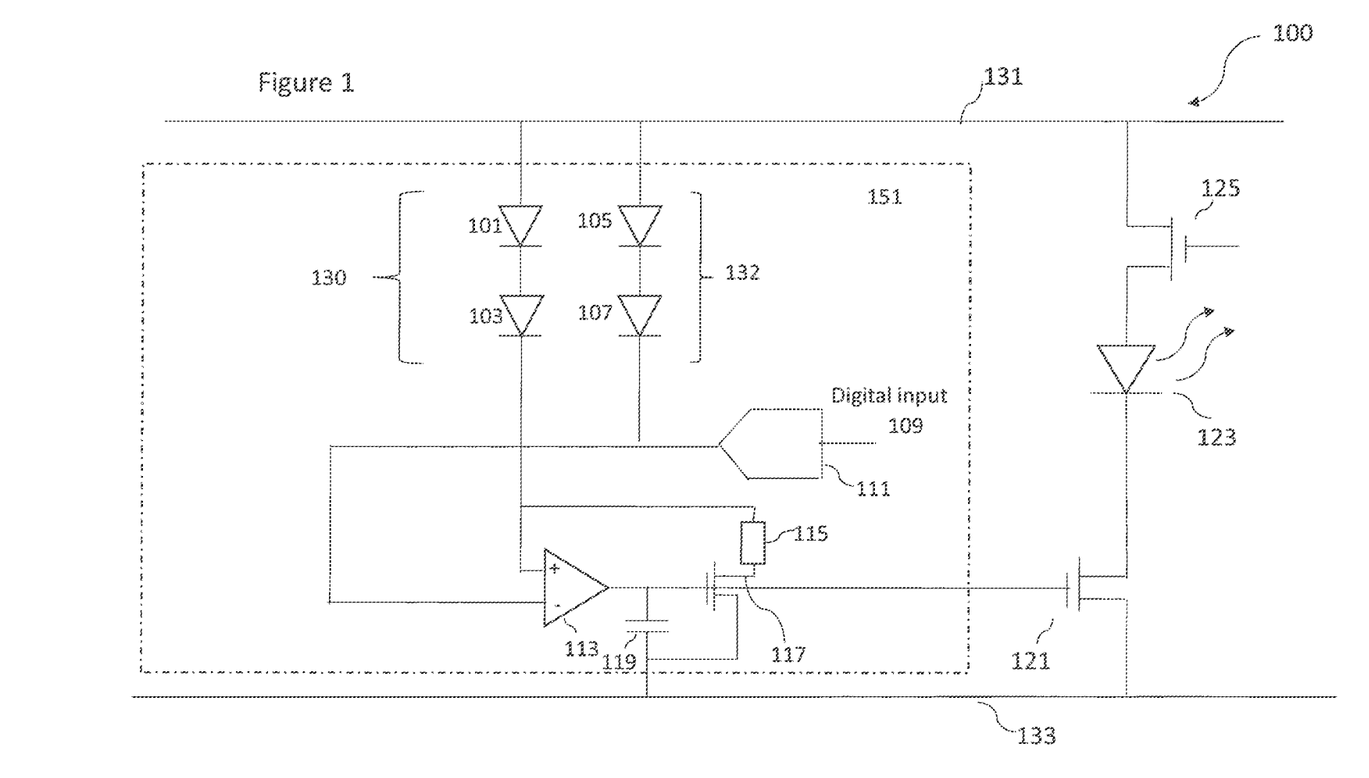
FIG. 1 show a schematic view of a typical laser diode current driver configuration.

A schematic view of a simplified example of a laser diode driver coupled to a laser diode is shown in FIG. 1. FIG. 1 shows the laser diode 123. The laser diode 123 anode is coupled to a safety transistor 125.

The safety transistor 125 is coupled to the laser diode 123 and also coupled to the positive supply rail 131. The safety transistor 125 is controlled by a safety input signal coupled to a gate of the safety transistor 125 and configured to connect or disconnect the laser diode 123 to the positive supply rail 131.

The laser diode 123 cathode is coupled to a drive transistor 121 which drives the laser diode 123 with a controllable current based on the drive reference voltage supplied by a regulator 151.

The regulator 151 may be a modeled voltage forward biased voltage generator 132 comprising a pair of forward biased diodes 105 and 107 in series between the positive supply rail 131 and a first (negative) op-amp input. The op-amp 113 first input and the anode of the diode 107 is driven by an output voltage from a digital-to-analog (DAC) converter 111. The DAC 111 can receive a digital input value which then outputs a suitable current output $I_{DAC}$ which impacts on the negative input of the operational amplifier 113.

The regulator 151 further comprises a further modeled voltage forward biased voltage generator 130 comprising a further pair of forward biased diodes 101 and 103 in series between the positive supply rail 131 and the feedback input (the positive input of the operational amplifier 113). The feedback input may be further coupled to a 'golden' resistor 115 which is configured to simulate the voltage drop caused by the linear response of the laser diode (also known as $R_s$). The 'golden' resistor 115 is coupled to the drain of a feedback transistor 117. The output of the operational amplifier 113 is coupled to the gate of the feedback transistor 117 and furthermore provides the drive reference voltage from the regulator 151 to the drive transistor 121. In some embodiments the output of the operational amplifier 113 is further coupled to the negative supply rail 133 by a decoupling capacitor 119.

In such a manner the laser diode may be driven by a controllable voltage. A typical VCSEL laser diode has a forward bias turn-on voltage ($V_f$~1.5V for GaAs or GaInAs Infrared Spectrum) and in addition, a linear region of operation that may be approximated by Ohm's Law, where electrical current is converted to optical power Such is the (VCSEL) laser diode linear region of operation, when it is limited by supply headroom, where the voltage drop across the diode, the voltage cannot exceed what is externally supplied to the chip, and it does not allow an increase to its lasing current beyond this voltage limitation.

As discussed hereafter the following examples overcome the issues with limited headroom voltages by employing an on-chip step up switching regulator (which may be in some embodiments a charge-pump) that is configured to deliver the performance needs.

As an on-chip step up regulator may be limited by its energy storage elements available for integration on the process platform and the switching frequency of the controlling regulator in some embodiments the implementation may employ a silicon process platform that has a high density Farad/Area Metal-Insulator-Metal capacitor, offering better die area utilization, and also freeing active device area below its stack. Furthermore an on-chip high frequency clock source may be employed to generate poly-phase (i.e., Multiple Phase) clocking for load-leveling (or sharing) of the switching regulator, enabling a scalable and modular approach to design as well as more flexibility in layout floor planning.

In implementing an independent close-loop regulation step up voltage, it is beneficial that the externally supplied voltage be kept as low as possible, minimizing power dissipation of the rest of the chip. As such efficiency losses attributed to the step up charge-pump may in some embodiments be cancelled by a corresponding reduction in external supply voltage.

In such embodiments the independent step-up voltage enables a flexible external supply range. In other words the input supply range does not impose a limitation on the output signaling power and/or impact system performance modeling. This allows the same circuitry to be employed in many applications and in situations where there are common industry standards, e.g. 2.8V for most camera module system or 3v3, 1v8, 1v1 standard logic implementation or marketing as an ASSP for open market adoption.

In the following embodiments where a user chooses to power the chip within a sufficient supply voltage, this implementation may also allow multiplexing of supply between external or internal supply, thus disabling the charge-pump if not in use and operating with no penalties.

In some embodiments the circuitry may be configured to dynamically regulate the step-up voltage (as compared to operating with a static level regulated system). A static level has an output voltage line regulation in a closed-loop with respect to a voltage reference as a set-point. The dynamic loop regulation relies on determining that the laser diode (VCSEL) driver current source is biased in a 'saturation' region. The advantage of this power envelope tracking allows a reduction of 'excess' voltage. As such, the laser diode (VCSEL) driver may be configured to operate with 'just enough' headroom and without an excess headroom adding to on chip power dissipation. In such embodiments the dynamic loop regulation scheme may be able to gain approximately an additional 10% reduction in power load on the step up voltage (for example being able to operate at 3.2V vs 3.6V).

Furthermore in some embodiments a lower electromagnetic interference (EMI) emission is observed by measurement by decoupling the laser diode pulse train transient (an EMI di/dt source) with the charge-pumping output reservoir capacitor on the anode of the laser diode. With the charge-pump output decoupled, the average load current on the external supply (which powers the charge-pump) may be a filtered load current with a reduced signature of the laser diode pulse train.

In some embodiments the charge-pump is driven with a multiple phase (poly-phase) clock. This enables the switching noise to have a much higher fundamental frequency (in other words 8 phases at 62.5 MHz=500 MHz). This produces harmonics which are outside of the usual frequency bands of interest and which is therefore beneficial in situations where the driver is employed in chip-sets on mobile phone and similar user equipment or mobile computing with transceiver capability.

Figure 2:
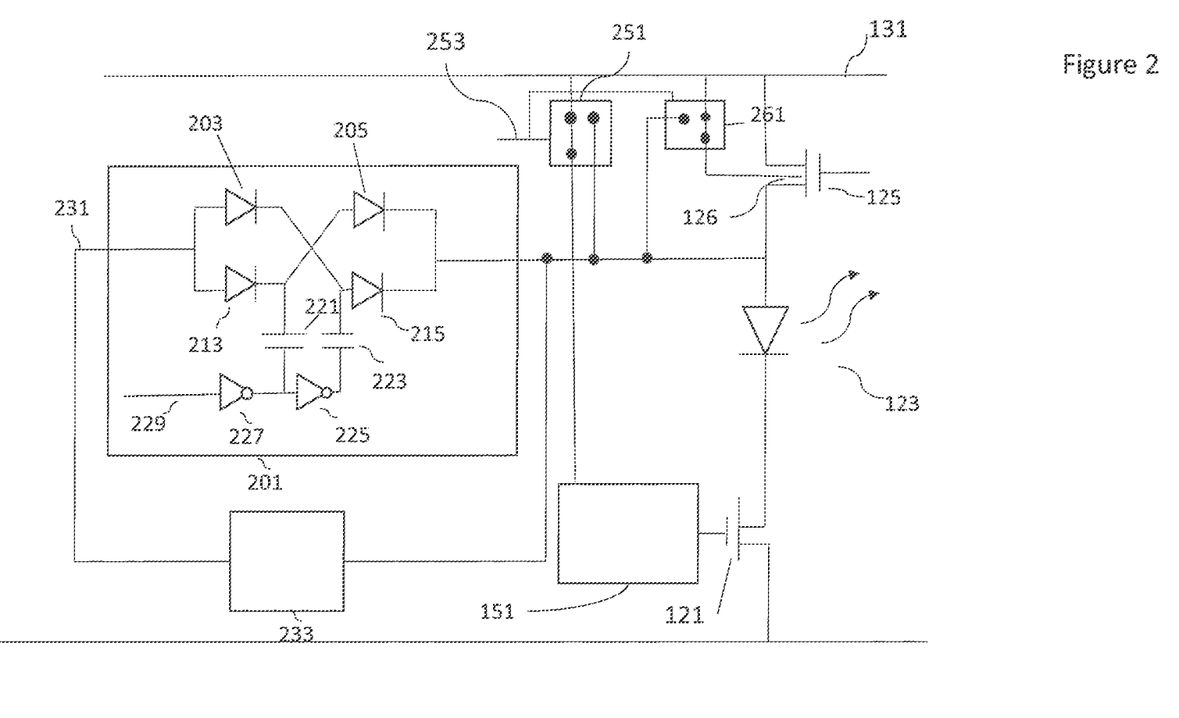
FIG. 2 shows a schematic view of a laser diode current driver with charge-pump configuration according to some embodiments.

With respect to FIG. 2 an example schematic view of a laser diode current driver with charge-pump configuration according to some embodiments is shown.

The example shown in FIG. 2 comprises the laser diode 123. The laser diode 123 anode is coupled to the (PMOS) safety transistor 125 as shown in FIG. 1. However although the (PMOS) safety transistor is coupled to the laser diode 123 its bulk 126 (i.e., PMOS MOSFET device NWELL) is coupled to switch 261.

The switch 261 is configured to controllably couple the safety transistor 125 bulk 126 to one of either the positive supply rail 131 or a charge-pump 201 output.

The laser diode 123 anode is also coupled to the charge-pump 201 output.

The switch 261 furthermore is controlled by a charge-pump enable signal 253 such that when the charge-pump enable signal 253 enables the charge-pump to be active then the switch 261 couples the safety transistor (bulk) to the charge-pump output and when the charge-pump enable signal 253 indicates the charge-pump is not active then the switch 261 couples the safety transistor (bulk) to the positive supply rail 131.

In such a manner the charge-pump may be enabled to supply an increased voltage to the laser diode and in such a manner isolate the charge-pump output from the positive supply rail 131, where the charge-pump 201 output do not forward bias the PMOS safety transistor drain (i.e. device P+) to bulk (device's NWELL)

Furthermore the laser diode cathode is coupled to the drive transistor 121 which drives the laser diode 123 with a controllable current based on the drive reference voltage supplied by a regulator 151.

The regulator 151 may comprise a modeled voltage forward biased voltage generator and further modeled voltage forward biased voltage generator, both of which are coupled to a further switch 251. The further switch 251 is configured to controllably couple the modeled voltage forward biased voltage generator and further modeled voltage forward biased voltage generator to one of either the positive supply rail 131 or the charge-pump 201 output.

The further switch 251 is also controlled by the charge-pump enable signal 253 such that when the charge-pump enable signal 253 enables the charge-pump to be active then the further switch 251 couples the modeled voltage forward biased voltage generator and further modeled voltage forward biased voltage generator to the charge-pump output and when the charge-pump enable signal 253 indicates the charge-pump is not active then the further switch 251 couples the safety transistor (bulk) to the positive supply rail 131.

In such a manner the modeled voltage forward biased voltage generator and further modeled voltage forward biased voltage generator can model the voltage across the laser diode when the laser diode is coupled to either the charge-pump output or the positive supply rail.

Furthermore is shown a charge-pump 201. The charge-pump 201 is a conventional charge-pump and comprises a series of coupled diode pairs which are charge-pumped by capacitors and a clocked input. The charge-pump 201 is shown comprising a first pair of forward biased diodes 203 and 213 configured to receive a regulated voltage input 231 and a second pair of forward biased diodes 205 and 215. The diode 203 is coupled to diode 215 and diode 213 is coupled to diode 205. The outputs of the diodes 205 and 215 are used as the charge-pump 201 output. The output of diode 213 and the input to diode 205 is coupled to one terminal of the capacitor 221 which is further coupled to the output of the first inverter 227. The first inverter 227 is configured to receive the charge-pump clock signal 229. The output of the first inverter 227 is coupled to the input of the second inverter 225. The output of the second inverter 225 is coupled to one terminal of a capacitor 223 which is coupled via the other terminal to the output of diode 203 and at the input of diode 215.

The charge-pump uses the switching of the capacitors to charge-pump the output. In other words the charge-pump operates as a switching device to control a dc-to-dc voltage boost based on the charge stored in the capacitors.

In some embodiments the regulator voltage input 231 which is the input voltage to the charge-pump may be provided by a feedback loop between the charge-pump output and the input. For example as shown in FIG. 2 in some embodiments a potential divider and comparator circuit 233 is used to provide the output voltage regulation, where the voltage regulator feedback input and control of the output regulation voltage to be based on a fraction of the charge-pump output voltage. Thus for example the charge-pump 201 may be provided by a closed loop feedback voltage compared to a reference voltage (for example provided by a band gap diode as shown in FIG. 2).

In some embodiments the charge-pump is configured to ensure that an excess voltage margin is provided for the laser diode driver to operate comfortably in the switched current source mode.

In some embodiments a dynamic charge-pump architecture can be implemented. For example with respect to FIG. 3 a dynamic charge-pump architecture is shown. In this example the difference between the dynamic charge-pump and the static charge-pump is in the generation of the charge-pump 201 output. Whereas in the static charge-pump the regulator voltage feedback is generated by a feedback loop coupled to the charge-pump output, the example dynamic charge-pump architecture generates the charge-pump regulator voltage feedback from signals within the regulator 151 supplying the current for the laser diode.

Figure 3:
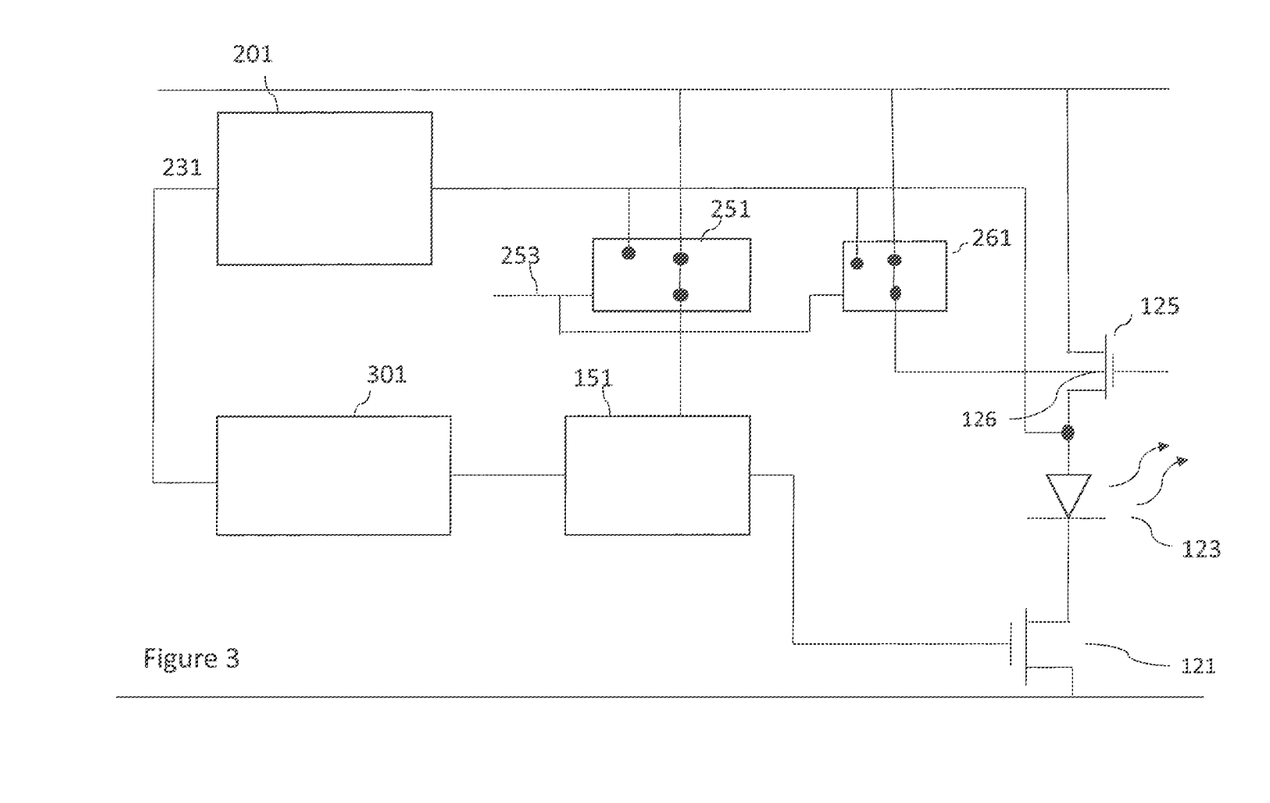
FIG. 3 shows a schematic view of a further laser diode current driver with charge-pump configuration according to some embodiments.

Thus as shown in FIG. 3 the circuit comprises the laser diode 123 with the laser diode 123 anode coupled to the safety transistor 125.

The safety transistor 125 (drain) is furthermore coupled to the laser diode 123 (anode) at one terminal and further, safety transistor's bulk is coupled by the bulk terminal (of safety transistor 125) to the switch 261.

The switch 261 is configured to controllably couple the safety transistor 125 bulk 126 to one of either the positive supply rail 131 or a charge-pump 201 output.

The laser diode 123 anode is also coupled to the charge-pump 201 output.

The switch 261 furthermore is controlled by a charge-pump enable signal 253 such that when the charge-pump enable signal enables the charge-pump to be active (for example, with a logical high level or '1') then the switch 261 couples the safety transistor bulk 126 to the charge-pump output and when the charge-pump enable signal 253 (for example with a logical low level or '0') indicates the charge-pump is not active then the switch 261 couples the safety transistor (bulk) to the positive supply rail 131.

In such a manner the charge-pump may be enabled to supply an increased voltage to the laser diode and in such a manner isolate the charge-pump output from the positive supply rail 131.

In the example shown in FIG. 3 the dynamic charge-pump architecture circuit comprises the dynamic control circuitry 301. The dynamic control circuitry 301 may comprise a further modeled voltage forward biased voltage generator comprising a further pair of forward biased diodes in series between a switch (the switch configured to connect the diodes to either the positive supply rail 131 or the charge-pump output) and a comparator input (for example a positive input of an operational amplifier). The comparator input may be further coupled to a 'golden' resistor which is configured to simulate the voltage drop caused by the linear response of the laser diode (also known as $R_s$). The 'golden' resistor may be coupled to the drain of a feedback transistor, the gate of which is further coupled to the drive reference voltage from the regulator 151.

The comparator may have a further input (for example a negative input of the operational amplifier) which is provided from the output of the digital to analogue converter of the regulator 151.

In such a manner the dynamic charge-pump dynamic control circuitry 301 is configured to regulate the charge-pumping voltage above the positive supply rail to maintain that the laser diode driver always operates in the switched current mode source but does so at the boundary of the saturation region.

In such a manner the excess margin operating in a static charge-pump mode is reduced. Furthermore by the dynamic control circuitry 301 being able to (input) signal track the circuit is able to provide improved power dissipation and efficiency. This is for example suitable in applications such as radio frequency front end envelope tracking for signals with a large peak to average ratio or buck-boost for audio signal amplifiers with a linear output power stage to speakers or headphones.

For operation in charge-pump mode, the dynamic lasing overcurrent detection is taken over by charge-pump 201, where it senses the average output current against a programmable trip threshold current (i.e. the safe limit). This in comparison to an implementation, serving similar purpose but utilizing the safety switch 125 such as shown in U.S. Pat. No. 9,780,527.

In some embodiments the switches (251 and 261 in FIG. 3) configured to couple to either the positive supply rail or the charge-pump output to components may be implemented as a supply bulk multiplexer.

Figure 4:
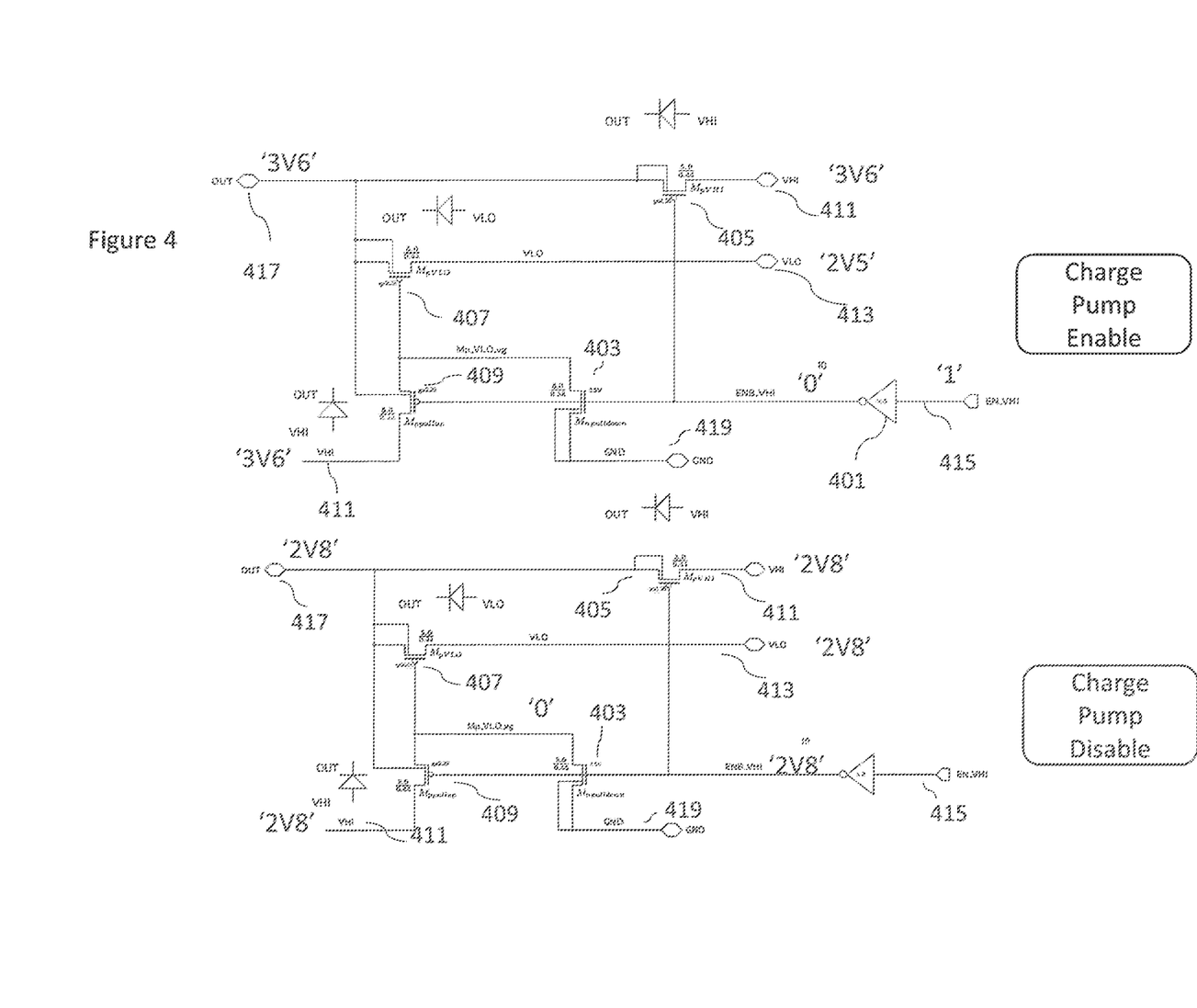
FIG. 4 shows a schematic view of the operation of the supply bulk multiplexing and gating control within the laser diode current driver with charge-pump configuration examples according to some embodiments.

With respect to FIG. 4 is shown an example supply bulk multiplexer which may be employed as a switch as shown in the embodiments above for coupling components to either a high voltage input (for example the charge-pump output) and low voltage input (for example the positive supply rail) to output as implemented by the switches.

The upper part of FIG. 4 shows the situation when the charge-pump is enabled. In this example the charge-pump output or high voltage input VHI 411 is at 3.6 volts, the positive supply rail or low voltage input VLO 413 is at 2.5 volts and the charge-pump enable signal EN_VHI 415 is logically high ('1').

An example supply bulk multiplexer comprises an inverter 401 configured to receive the charge-pump enable signal EN_VHI 415 (enable VHI) and configured to output an inverted charge-pump enable signal ENB_VHI value, which in this example is a logically low (or '0' or 0 volt) value.

The inverted charge-pump enable signal ENB_VHI value may be coupled to a gate of a first PMOS transistor 405. The first PMOS transistor 405 is configured with a source coupled to charge-pump output or high voltage input VHI 411 and the bulk and drain coupled to the output OUT 417.

A second PMOS transistor 407 is configured such that a source is coupled to the low voltage input or positive supply rail VLO 413 and the bulk and drain coupled to the output OUT 417. The second PMOS transistor 407 is further coupled to a drain of a third PMOS transistor 409 and a source of a NMOS transistor 403.

A third PMOS transistor 409 is configured such that a drain is coupled to the gate of the second PMOS transistor 307, a source terminal is coupled to charge-pump output or high voltage input VHI 411, the bulk is coupled to the output OUT 417 and a gate is coupled to the output of the inverter 401 and receive the inverted charge-pump enable signal ENB_VHI.

A NMOS transistor 403 is configured such that the drain is coupled to the gate of the second PMOS transistor 307, a source terminal and the bulk is coupled to the ground GND 419 and a gate terminal is coupled to the output of the inverter 401 and receive the inverted charge-pump enable signal ENB_VHI.

As such when the charge-pump enable is high the first PMOS transistor is enabled to pass the charge-pump output or high voltage input VHI 411 at 3.6 volts to the output node 417. Furthermore the output of the inverter couples the gate of the second PMOS transistor 407 to the charge-pump output or high voltage input VHI 411 via the third PMOS transistor 409. As the gate of the second PMOS transistor 407 is high (3.6 volts) then the second PMOS transistor isolates the low voltage input or positive supply rail VLO 413 from the output node OUT 417. It is for this implementation that enables bulk switching of the safety switch 125 to a voltage (charge-pump 201 output) higher the supply rail (131)

The lower part of FIG. 4 shows the situation when the charge-pump is disabled. In this example the charge-pump output or high voltage input VHI 411 is at 2.8 volts, the positive supply rail or low voltage input VLO 413 is at 2.8 volts and the charge-pump enable signal EN_VHI 415 is logically low ('0').

The output of the inverter 401 is therefore a high 2.8 volt signal. As such when the charge-pump enable is high the first PMOS transistor is isolates the charge-pump output or high voltage input VHI 411 at 2.8 volts from the output node 417. Furthermore the output of the inverter couples the gate of the second PMOS transistor 407 to the ground GND 419 via the NMOS transistor 403. As the gate of the second PMOS transistor 407 is low ('0') then the second PMOS transistor couples the low voltage input or positive supply rail VLO 413 to the output node OUT 417.

In some embodiments this switch cannot be implemented using a T-gate configuration.

In such a manner the charge-pump may be implemented and which may be 'transparent' to the user of the device and its operation be manipulated using only software control, without any need for hardware modification.

Figure 5:
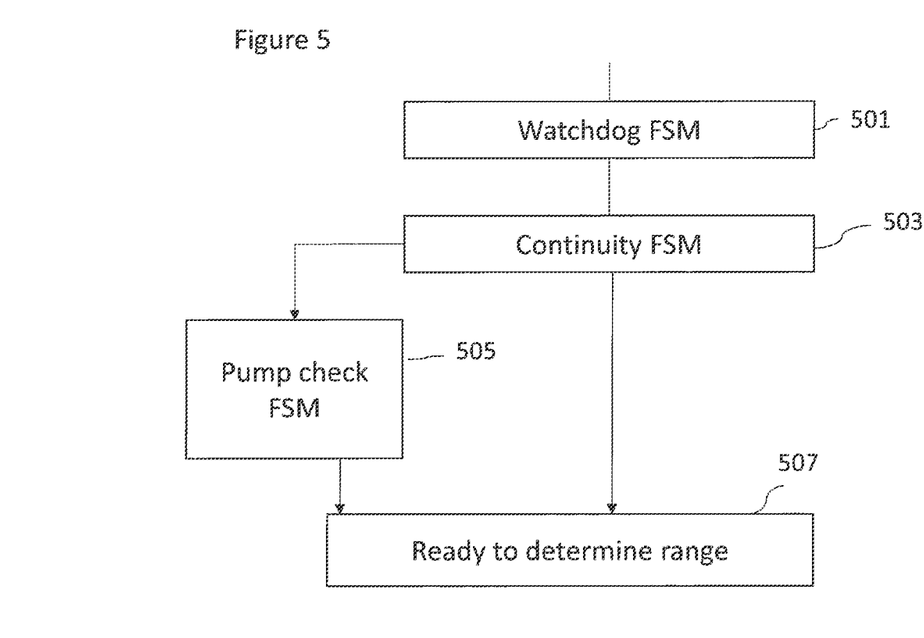
FIG. 5 shows a flow diagram of the configuration operation prior to determining ranges or distances using the laser diode current drivers with charge-pumps as shown in FIGS. 2 to 4.

With respect to FIG. 5 a flow diagram showing the implementation of the integrated charge-pump in ranging operations.

In some embodiments a watchdog finite state machine is implemented to configure and check the functionality of clock and laser functions of the circuitry. The watchdog functionality checks are shown in FIG. 5 by step 501.

In some embodiments following the end of the watchdog functionality checks a continuity finite state machine is then implemented. The continuity finite state machine checks are shown in FIG. 5 by step 503. It covers a set of integrity checks, to ensure functionality of the laser diode driver and it detects single-point failure within the driver circuitry that can result in laser unsafe condition of operation.

In some embodiments one of the finite state checks is to initialize a charge-pump initialization operation as shown in FIG. 5 by step 505. The initialization of the charge-pump initialization operation may be performed in parallel with the continuity finite state machine operations such that when the charge-pump has been initialized the continuity checks are also completed and any range/distances can be determined shown by the ready to determine range operation shown in FIG. 5 by step 507. In reiteration, it demonstrates operation of charge-pump is 'transparent' to the user, with no impact in a system boot up sequence, where it is integrated.

Various embodiments with different variations have been described here above. It should be noted that those skilled in the art may combine various elements of these various embodiments and variations.

Such alterations, modifications, and improvements are intended to be part of this disclosure, and are intended to be within the scope of the present invention. Accordingly, the foregoing description is by way of example only and is not intended to be limiting. The present invention is limited only as defined in the following claims and the equivalents thereto.

What is claimed is:

1. A driver circuit for a laser diode configured to pass a current, the driver circuit comprising:
a drive transistor configured to supply the laser diode with a controllable current;
a regulator configured to control the drive transistor, wherein the regulator comprises an input for indicating a controllable current target value and a forward biased modeled voltage generator configured to model the laser diode;
a charge-pump configured to generate an output boosted positive supply rail voltage;
a first switch circuit configured to couple the output of the charge-pump to the regulator in response to the charge-pump being enabled and couple the positive supply rail to the regulator in response to the charge-pump being disabled; and
a second switch circuit configured to couple the output of the charge-pump to a terminal of the laser diode and to isolate the positive supply rail from the terminal of the laser diode in response to the charge-pump being enabled.

2. The driver circuit as claimed in claim 1, wherein the second switch circuit is further configured to isolate the output of the charge-pump from the terminal of the laser diode and to couple the positive supply rail to the terminal of the laser diode in response to the charge-pump being disabled.

3. The driver circuit as claimed in claim 1, further comprising a charge-pump regulator voltage generator configured to supply an input voltage to the charge-pump, wherein the charge-pump regulator voltage generator comprises one of a static charge-pump regulator voltage generator or a dynamic charge-pump regulator voltage generator.

4. The driver circuit as claimed in claim 3, wherein the dynamic charge-pump regulator voltage generator comprises:
a comparator configured to compare a portion of a controllable current target value and a further forward biased modeled voltage generator configured to model the laser diode; and
a further switch circuit configured to couple the output of the charge-pump to the further forward biased modeled voltage generator in response to the charge-pump being enabled and couple the positive supply rail to the further forward biased modeled modelled voltage generator in response to the charge-pump being disabled.

5. The driver circuit as claimed in claim 1, wherein the second switch circuit comprises a single switch.

6. The driver circuit as claimed in claim 1, wherein the second switch circuit comprises a bulk switch.

7. The driver circuit as claimed in claim 6, wherein the bulk switch comprises:
an inverter configured to receive a charge-pump enable signal and configured to output an inverted charge-pump enable signal;
a first PMOS transistor configured with a gate node coupled to the inverted charge-pump enable signal, a source node coupled to a charge-pump output and a bulk node and drain node coupled to a bulk switch output;
a second PMOS transistor configured with a source node coupled to a lower voltage input and a bulk node and drain node coupled to the bulk switch output;
a third PMOS transistor configured with a drain node coupled to a gate node of the second PMOS transistor, a source node coupled to the charge-pump output, a bulk node coupled to the bulk switch output and a gate node coupled to the inverted charge-pump enable signal; and
a NMOS transistor configured with a drain node coupled to the gate node of the second PMOS transistor, a source node and a bulk node coupled to a ground node and a gate node coupled to the inverted charge-pump enable signal.

8. A range detector comprising:
a laser diode;
a charge-pump configured to generate an output boosted positive supply rail voltage;
a switch circuit configured to couple the output of the charge-pump to a terminal of the laser diode and to isolate the positive supply rail from the terminal of the laser diode in response to the charge-pump being enabled;
clocking circuitry;
a first state machine circuit configured to confirm operations of the clocking circuitry;
a second state machine circuit configured to confirm operations of the charge-pump and switch circuit; and
a third state machine circuit configured to confirm the operations of the charge-pump, wherein the operations of the third state machine circuit are initialized by the operations of the second state machine circuit.

9. The range detector as claimed in claim 8, wherein the switch circuit is further configured to isolate the output of the charge-pump from the terminal of the laser diode and to couple the positive supply rail to the terminal of the laser diode in response to the charge-pump being disabled.

10. The range detector as claimed in claim 8, further comprising:
a drive transistor configured to supply the laser diode with a controllable current;
a regulator configured to control the drive transistor, wherein the regulator comprises an input for indicating a controllable current target value and a forward biased modeled voltage generator configured to model the laser diode; and
a further switch circuit configured to couple the output of the charge-pump to the regulator in response to the charge-pump being enabled and couple the positive supply rail to the regulator in response to the charge-pump being disabled.

11. The range detector as claimed in claim 8, further comprising a charge-pump regulator voltage generator configured to supply an input voltage to the charge-pump, wherein the charge-pump regulator voltage generator comprises one of a static charge-pump regulator voltage generator or a dynamic charge-pump regulator voltage generator.

12. The range detector as claimed in claim 11, wherein the dynamic charge-pump regulator voltage generator comprises:
a comparator configured to compare a portion of a controllable current target value and a further forward biased modeled voltage generator configured to model the laser diode; and
a further switch circuit configured to couple the output of the charge-pump to the further forward biased modeled voltage generator in response to the charge-pump being enabled and couple the positive supply rail to the further forward biased modeled voltage generator in response to the charge-pump being disabled.

13. The range detector of claim 8, wherein the switch circuit comprises a bulk switch comprising:
- an inverter configured to receive a charge-pump enable signal and configured to output an inverted charge-pump enable signal;
- a first PMOS transistor configured with a gate node coupled to the inverted charge-pump enable signal, a source node coupled to a charge-pump output and a bulk node and drain node coupled to a bulk switch output;
- a second PMOS transistor configured with a source node coupled to a lower voltage input and a bulk node and drain node coupled to the bulk switch output;
- a third PMOS transistor configured with a drain node coupled to a gate node of the second PMOS transistor, a source node coupled to the charge-pump output, a bulk node coupled to the bulk switch output and a gate node coupled to the inverted charge-pump enable signal; and
- a NMOS transistor configured with a drain node coupled to the gate node of the second PMOS transistor, a source node and a bulk node coupled to a ground node and a gate node coupled to the inverted charge-pump enable signal.

14. A method for driving a laser diode, the method comprising:
- supplying the laser diode with a controllable current using a drive transistor;
- controlling the drive transistor with a regulator configured to receive a controllable current target value;
- enabling a charge-pump to generate an output boosted positive supply rail voltage;
- coupling the output of the charge-pump to the regulator in response to the charge-pump being enabled;
- coupling the positive supply rail to the regulator in response to the charge-pump being disabled;
- coupling the output boosted positive supply rail voltage to a terminal of the laser diode in response to the charge-pump being enabled; and
- isolating the positive supply rail from the terminal of the laser diode in response to the charge-pump being enabled.

15. The method as claimed in claim 14, further comprising:
- isolating via the output boosted positive supply rail of the charge-pump from the terminal of the laser diode in response to the charge-pump being disabled; and
- coupling the positive supply rail to the terminal of the laser diode in response to the charge-pump being disabled.

16. The method as claimed in claim 15, wherein the coupling and the isolating are performed using a switch circuit.

17. The method as claimed in claim 14, further comprising supplying, by a charge-pump regulator voltage generator, an input voltage to the charge-pump, wherein the charge-pump regulator voltage generator comprises one of a static charge-pump regulator voltage generator or a dynamic charge-pump regulator voltage generator.

18. The method as claimed in claim 17, wherein supplying the input voltage to the charge-pump comprises comparing a portion of the output of the charge-pump to a determined reference voltage.

19. The method as claimed in claim 18, wherein supplying the input voltage to the charge-pump comprises:
- comparing a portion of a controllable current target value and a voltage model of the laser diode;
- coupling the output of the charge-pump as an input of the voltage model of the laser diode in response to the charge-pump being enabled; and
- coupling the positive supply rail as an input of the voltage model of the laser diode in response to the charge-pump being disabled.

20. The method of claim 14, wherein the coupling comprises coupling by a switch circuit, the method further comprising:
- confirming, by a first state machine circuit, operations of a clocking circuitry;
- confirming, by a second state machine circuit, operations of the charge-pump and the switch circuit; and
- confirming, by a third state machine circuit, operations of the charge-pump, wherein the operations of the third state machine circuit are initialized by the operations of the second state machine circuit.

* * * * *

UNITED STATES PATENT AND TRADEMARK OFFICE
CERTIFICATE OF CORRECTION

PATENT NO. : 11,196,229 B2  
APPLICATION NO. : 16/440619  
DATED : December 7, 2021  
INVENTOR(S) : Denise Lee et al.

Page 1 of 1

It is certified that error appears in the above-identified patent and that said Letters Patent is hereby corrected as shown below:

In the Claims

Claim 4, Column 11, Line 47; delete "biased modeled modelled voltage" and insert --biased modeled voltage--.

Signed and Sealed this  
Eighteenth Day of January, 2022

Drew Hirshfeld  
*Performing the Functions and Duties of the*  
*Under Secretary of Commerce for Intellectual Property and*  
*Director of the United States Patent and Trademark Office*